(12) United States Patent
Hashimoto

(10) Patent No.: US 10,365,718 B2
(45) Date of Patent: Jul. 30, 2019

(54) VIBRATING DEVICE AND TACTILE SENSE PRESENTING DEVICE

(71) Applicant: Murata Manufacturing Co., Ltd., Nagaokakyo-shi, Kyoto-fu (JP)

(72) Inventor: Junichi Hashimoto, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 18 days.

(21) Appl. No.: 15/367,891

(22) Filed: Dec. 2, 2016

(65) Prior Publication Data

US 2017/0083099 A1 Mar. 23, 2017

Related U.S. Application Data

(63) Continuation of application No. PCT/JP2015/065983, filed on Jun. 3, 2015.

(30) Foreign Application Priority Data

Jun. 9, 2014 (JP) .................................. 2014-118332

(51) Int. Cl.
   *G06F 3/01* (2006.01)
   *G06F 3/041* (2006.01)
   (Continued)

(52) U.S. Cl.
   CPC ............ *G06F 3/016* (2013.01); *B06B 1/0688* (2013.01); *G06F 3/041* (2013.01); *G06F 3/0414* (2013.01);
   (Continued)

(58) Field of Classification Search
   CPC . G06F 3/01; G06F 3/016; G06F 3/041; G06F 3/0414; G06F 2203/04102;
   (Continued)

(56) References Cited

U.S. PATENT DOCUMENTS 3,792,204 A * 2/1974 Murayama ............. H01G 7/023
                                                    310/322
4,045,695 A * 8/1977 Itagaki ................. H04R 17/005
                                                    310/322
(Continued)

FOREIGN PATENT DOCUMENTS

JP   2003-108311 A    4/2003
JP   2005-352927 A   12/2005
(Continued)

OTHER PUBLICATIONS

International Search Report issued for PCT/JP2015/065983, dated Aug. 18, 2015.
(Continued)

*Primary Examiner* — Jason M Mandeville
(74) *Attorney, Agent, or Firm* — Arent Fox LLP

(57) ABSTRACT

A tactile feedback device includes a vibrating device and a touch sensor. The vibrating device comprises a flexible diaphragm and a film which deforms in response to the application of electrical energy thereto, the film being attached to the flexible diaphragm at two spaced locations with a major surface of the film facing a major surface of the flexible diaphragm. The vibrating device further includes a spacer located between the two spaced locations and ensuring that the major surface of the flexible diaphragm is spaced from the major surface of the film. The touch sensor is coupled to the diaphragm and generates an output signal in response to a touch operation. Means are provided to apply electrical energy to the film in response to the output signal.

27 Claims, 8 Drawing Sheets

(51) Int. Cl.
  *B06B 1/06* (2006.01)
  *H01L 41/053* (2006.01)
  *H01L 41/08* (2006.01)

(52) U.S. Cl.
  CPC .......... *H01L 41/053* (2013.01); *H01L 41/081* (2013.01); *G06F 2203/04103* (2013.01)

(58) Field of Classification Search
  CPC ......... G06F 2203/04103; B06B 1/0644; B06B 1/0688; H01L 41/04; H01L 41/053; H01L 41/08; H01L 41/081; H01L 41/083
  USPC ....................................................... 345/173
  See application file for complete search history.

(56) References Cited

U.S. PATENT DOCUMENTS

| | | | | |
|---|---|---|---|---|
| 4,088,915 A | * | 5/1978 | Kodama | H04R 17/005 310/334 |
| 4,186,323 A | * | 1/1980 | Cragg | H04R 17/005 310/324 |
| 5,452,878 A | * | 9/1995 | Gravesen | F15C 5/00 251/129.01 |
| 5,856,956 A | * | 1/1999 | Toki | B06B 1/0603 310/324 |
| 5,867,302 A | * | 2/1999 | Fleming | B81B 3/0054 310/328 |
| 6,060,811 A | * | 5/2000 | Fox | H01L 41/0926 310/311 |
| 7,038,356 B2 | * | 5/2006 | Athanas | H04R 17/00 310/311 |
| 8,476,804 B2 | * | 7/2013 | Hishinuma | H01G 5/16 310/324 |
| 9,332,353 B2 | | 5/2016 | Ando | |
| 2003/0071795 A1 | | 4/2003 | Baldauf et al. | |
| 2007/0063982 A1 | * | 3/2007 | Tran | G06F 1/1616 345/173 |
| 2013/0335375 A1 | | 12/2013 | Nishikawa et al. | |
| 2014/0079255 A1 | | 3/2014 | Ando | |
| 2017/0160808 A1 | * | 6/2017 | Hashimoto | G06F 3/016 |
| 2018/0130941 A1 | * | 5/2018 | Usui | G06F 3/041 |

FOREIGN PATENT DOCUMENTS

| | | |
|---|---|---|
| JP | 2010-152889 A | 7/2010 |
| JP | 2012-242871 A | 12/2012 |
| WO | WO 2012/157691 A1 | 11/2012 |

OTHER PUBLICATIONS

Written Opinion of the International Searching Authority issued for PCT/JP2015/065983, dated Aug. 18, 2015.

* cited by examiner

VIBRATING DEVICE AND TACTILE SENSE PRESENTING DEVICE

CROSS REFERENCE TO RELATED APPLICATIONS

The present application is a continuation of International application No. PCT/JP2015/065983, filed on Jun. 3, 2015, which claims priority to Japanese Patent Application No. 2014-118332, filed on Jun. 9, 2014, the entire contents of each of which are incorporated herein by reference.

TECHNICAL FIELD

The present disclosure relates to a vibrating device including a diaphragm which is caused to vibrate when a driving voltage is applied to a piezoelectric film attached thereto, and a tactile feedback device which transmits the vibration of the vibrating device as tactile feedback to a user.

BACKGROUND ART

A vibrating device which includes a diaphragm vibrated by driving a piezoelectric film is used in a flat speaker or a haptics device (a tactile sense presenting device) as described, for example, in WO2012-0157691.

FIG. 9(A) is a side view of a vibrating device 101 employing a conventional configuration, and FIG. 9(B) is a top view of the vibrating device 101. The vibrating device 101 includes a piezoelectric film 102, a diaphragm 103 and frame members 104 and 105. The diaphragm 103 and the piezoelectric film 102 have rectangular shapes which are elongated in a length direction (the vertical direction as viewed in FIG. 9(B)). The piezoelectric film 102 is formed by stretching a PLLA (poly-L-lactic acid) film in a stretching direction (indicated by outlined arrows in FIG. 9(B)) and cutting the stretched PLLA film out in such a manner that the length direction of the piezoelectric film 102 forms a 45° angle with respect to the stretching direction. The piezoelectric film 102 formed in this way stretches and contracts in the width direction when a voltage is applied thereto. The frame members 104 and 105 are provided at opposite ends of the piezoelectric film 102 and extend in the length direction. Opposite ends of the diaphragm 103 are connected to the piezoelectric film 102 by the frame members 104 and 105, respectively. The diaphragm 103 flexes such that a center of the diaphragm 103 in the width direction is spaced apart from the piezoelectric film 102 (see FIG. 9(A)) and that the frame members 104 and 105 apply a tensile force to the piezoelectric film 102 in the direction of the solid arrows in FIG. 9(a). When an AC voltage is applied to the piezoelectric film 102, it vibrates in the width direction and the curvature of the diaphragm 103 fluctuates along with this vibration.

In the haptics device of FIGS. 9(A) and 9(B), a downward pressing force applied to the diaphragm 103 in the thickness direction may cause the diaphragm to flatten and become parallel to the piezoelectric film. When this happens, the diaphragm barely vibrates even when the piezoelectric film is vibrated in the width direction (the horizontal direction in FIG. 9(A)). As a result, it is difficult to provide the user with a tactile feedback. To prevent the diaphragm from being pushed and flattened, the diaphragm may be made thick and rigidity of the diaphragm may be improved. However, when this is done, the amount of the diaphragm bends becomes small and it is difficult to provide a tactile feedback to the user.

It is therefore an object of the present invention to provide a vibrating device and a tactile sense presenting device which can bend a diaphragm in a thickness direction from a flat state and can easily increase the amount the diaphragm bends in response to the vibration of the piezoelectric film.

SUMMARY OF THE INVENTION

A vibrating device according to the present invention includes a flexible diaphragm and a film which deforms in response to the application of electrical energy thereto. The film is attached to the flexible diaphragm at two spaced locations with a major surface of the film facing a major surface of the flexible diaphragm. A spacer is located between the two spaced locations and ensures that the major surface of the flexible diaphragm is spaced from the major surface of the film.

The vibratory device preferably has a length, a width and a height. The flexible diaphragm and the film are spaced apart in the height direction and the flexible diaphragm is flexible in the height direction. The flexible diaphragm deforms in response to deformation of the film when electrical energy is applied to the vibratory film. More preferably the diaphragm vibrates in response to vibration of the film when an alternating electric voltage is applied to the vibratory film.

The spacer preferably contacts both the diaphragm and the film both before electrical energy is applied to the film and after it is applied to the film. The spacer preferably includes a base portion facing the film and a plurality of protrusion portions facing the diaphragm. The base portion is preferably in contact with the film and the plurality of protrusions are preferably in contact with the diaphragm.

The vibrating device preferably has a length, a width and a thickness extending perpendicular to one another and the spacer is elongated and extends in length direction of the vibrating device. Preferably the plurality of protrusions extend in the thickness direction of the vibrating device and a plurality of the spacers are aligned in the length direction of the vibrating device.

In one embodiment, the diaphragm has a flat shape when electrical energy is not applied to the film. In others, it is curved. The film preferably comprises a chiral polymer film or a polyvinylidene fluoride film.

As a result of the foregoing structures it is possible to reliably bend/vibrate the diaphragm in the thickness direction by driving the film even when the diaphragm is in a flat state. Further, even when the diaphragm is thin and not very rigid, a gap between the diaphragm and the film is maintained. Consequently, it is possible to make the diaphragm thin and less rigid and increase the amount of flexure in the diaphragm.

The spacer is preferably provided between the diaphragm and the film and is in contact with the diaphragm and the film at all times. According to this configuration, the spacer can be sandwiched between and held by the diaphragm and the film.

In some embodiments, a plurality of the spacers are preferably aligned in the length direction of the vibrating device. The positions of the spacers are such that they define nodes of a vibration of the diaphragm when electrical energy is applied thereto. The harmonic can be set to an appropriate frequency by adjusting the number and positions of the spacers. Generally, a vibrational frequency in a range of 100 Hz to 300 Hz is good for a tactile feedback on a finger (which means high sensitivity). Consequently, a vibrating device whose resonance frequency is less than 100 Hz can adjust the harmonic of the vibration caused by the diaphragm to a frequency of 100 Hz to 300 Hz by adjusting the numbers and the positions of the spacers.

The diaphragm may have a flat shape when no electrical energy is applied to the film and yet, as a result of the use of the spacer, the diaphragm can be sufficiently bent to provide good tactile feedback to the user. As a result, it is possible to use the vibrating device for a wide range of uses.

The foregoing vibrating device can be used in a tactile feedback device which includes a touch sensor coupled to the diaphragm and generating an output signal in response to a touch operation and means for applying electrical energy to the film in response to the output signal.

According to the present invention, the vibrating device and the tactile feedback device can reliably bend the diaphragm in the thickness direction even when the diaphragm is in a flat state.

DESCRIPTION OF THE PREFERRED EMBODIMENTS

Figure 1A:
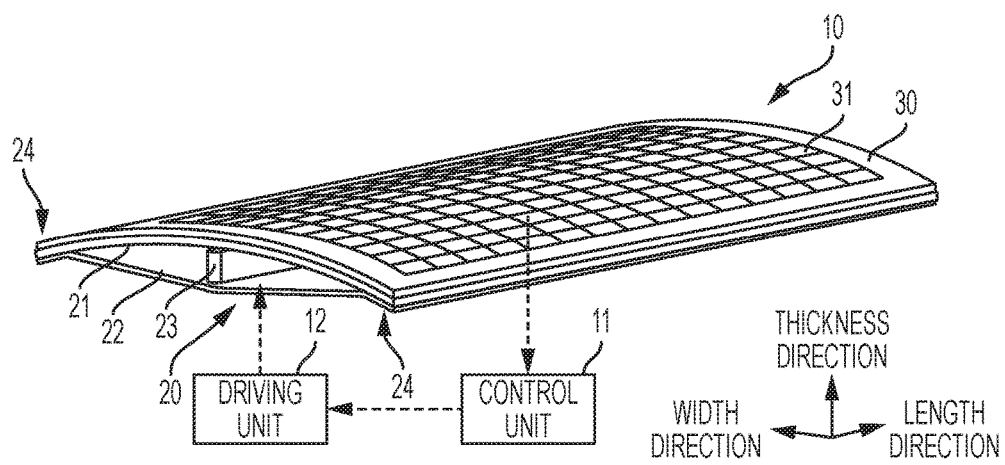
FIGS. 1(A) and 1(B) are a perspective view of and a partially broken plan view, respectively, of a top surface of a tactile feedback device according to a first embodiment.

A plurality of embodiments for carrying out the present invention will be described with reference to some specific examples. Each embodiment is exemplary, and components described in different embodiments may be replaced or combined.

The tactile feedback device 10 in the present embodiment is part of a touch sensor keyboard. The tactile feedback device 10 includes a control unit 11, a driving unit 12, a vibrating device 20 and a touch panel 30. In addition, the tactile sense presenting device 10 may include a switch having a sheet shape, such as a membrane switch, in place of the touch panel 30. A key position to be displayed or an indication can be arbitrarily changed using the touch panel 30.

The vibrating device 20 and the touch panel 30 are preferably thin in a thickness direction and are stacked in the thickness direction. The touch panel 30 is disposed at a top panel side in the thickness direction with respect to the vibrating device 20. The touch panel 30 includes a plurality of touch sensors 31 exposed on the top panel of the tactile feedback device 10. A plurality of touch sensors 31 are disposed at positions corresponding to a key alignment of the keyboard. Each touch sensor 31 outputs a respective detection signal to the control unit 11 when it detects a user's touch operation.

The control unit 11 outputs a control signal to the driving unit 12 in response to an input detection signal received from one or more of the touch sensors 31. The driving unit 12 outputs a drive voltage to the vibrating device 20 in response to the receipt of a control signal from the control unit 11. The control unit 11 and the driving unit 12 cooperate to form a means for applying electrical energy to the film in response to the output signal.

The vibrating device 20 includes a diaphragm 21, a piezoelectric film 22 and a spacer 23. The diaphragm 21 is preferably made of an elastically deformable material such as an acrylic resin PMMA. Other materials which can be used include a metal plate, PET, polycarbonate (PC), PLLA and glass. The diaphragm 21 is disposed above the piezoelectric film 22 in the thickness direction. The diaphragm 21 has a rectangular shape when seen from above, and has short sides which lie along a width direction and long sides which lie along a length direction. Further, the diaphragm 21 is preferably curved so that it protrudes toward the top surface of the tactile feedback device 10. The top surface of the diaphragm 21 is joined to the touch panel 30, for example with an adhesive or the like interposed therebetween. As a result, the touch panel 30 has a curved shape corresponding to the curved shape of the diaphragm 21.

The piezoelectric film 22 has two flat planar sections, each extending from an opposite side of spacer 23 and vibrates along those planar sections when electrically driven by an alternating voltage. The piezoelectric film can take other shapes, including the shape of a curved plane, as long as it vibrates in a manner that causes the diaphragm 21 to vibrate (more generally bend) with the vibration of the piezoelectric film.

The piezoelectric film 22 is preferably composed of a film made of a piezoelectric material having electrodes (not illustrated) provided on the entirety of both principal surfaces of the film. The piezoelectric material of the piezoelectric film 22 is preferably, for example, poly-L-lactic acid (PLLA) which is chiral polymers, and is polyvinylidene fluoride (PVDF). The piezoelectric film 22 composed of PLLA and formed by following steps has piezoelectricity to stretch and contract in the length direction. The steps include stretching a film in a main stretching direction indicated by an outlined arrow in FIG. 2(B); and then cutting the film in such a manner that its length direction extends approximately 45° with respect to the main stretching direction.

Other films may be substituted for the piezoelectric film as long as the films have the property that the films cause vibration when electrically driven. For example, the "film" may be composed as a composite film or an electroactive film. Electroactive films are ones which cause a stress or displacement in the plane of the film when electrically driven. A composite film may be formed by adding a piezoelectric film, the electroactive film or piezoelectric ceramics to a base material such as a resin film. The composite film or the electroactive film may be composed of a piezoelectric film, piezoelectric ceramics, an electrostriction film, an electret film, an electrically driven elastomer, a urethane rubber, a silicon rubber, a fluororubber, a nitrile rubber, a diene rubber or a liquid crystal elastomer.

Figure 1B:
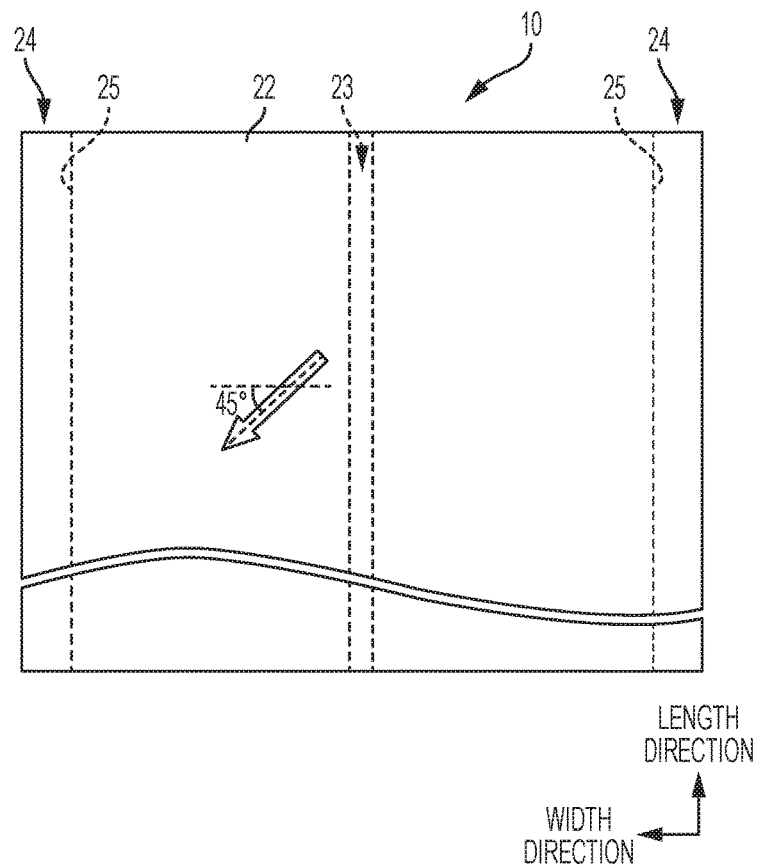

The piezoelectric film 22 is disposed below the diaphragm 21 and connected to the diaphragm 21 at the opposite lateral edges thereof. More particularly, the lateral ends of the piezeolectic film 22 and the diaphragm 21 are connected together (e.g., glued together) along end areas 24 extending from the outermost edges of the piezoelectric film 22 and the diaphragm 21 inwardly towards the center of vibrating device 20 and terminate at spaced locations 25 shown in dotted lines in FIG. 1(B) of the diaphragm 21. As a result, the piezoelectric film 22 is stretched between the two fixed end areas 24. The vibrating device 20 and the tactile feedback device 10 are preferably supported on an installation surface of a table or the like at the two fixed end areas 24.

Because the piezoelectric film 22 is stretched (i.e., is in a tensile state) between the fixed end areas 24, a tensile force is transmitted from the piezoelectric film 22 to the diaphragm 21 causing the diaphragm 21 to elastically deform to attain a curved shape with a space being formed between the upper principle surface of the piezoelectric film 22 and the lower principle surface of the diaphragm 21. Further, a spacer 23 is provided in a gap between the diaphragm 21 and the piezoelectric film 22, preferably near a center position between the opposite end areas 24 as viewed in FIG. 1(B). The presence of the spacer 21 ensures that there will be a gap between the upper principle surface of the piezoelectric film 22 and the lower principle surface of the diaphragm 21 even when the piezoelectric film contracts and expands in response to the application of an alternating voltage.

Figure 2:
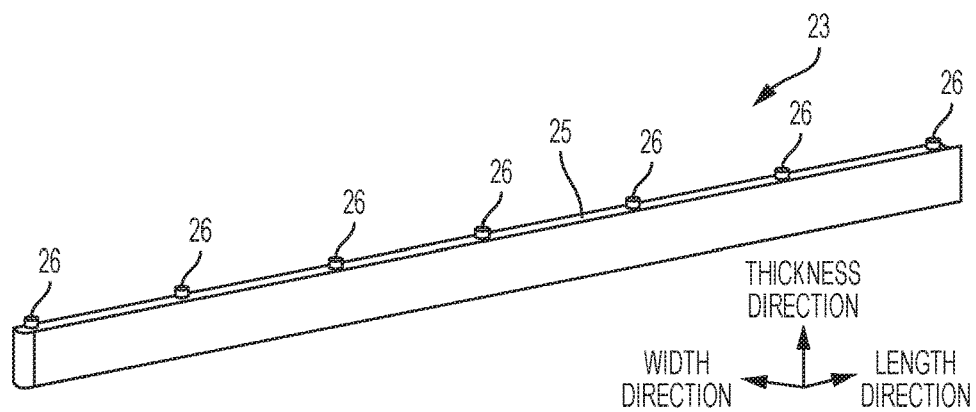
FIG. 2 is a perspective view of a spacer according to the first embodiment.

FIG. 2 is a perspective view of the spacer 23. The spacer 23 is made of metal, PET or polycarbonate (PC), for example. The spacer 23 preferably has high rigidity to prevent attenuation of vibrations of the diaphragm 21 and the piezoelectric film 22, and may be made of a material of a higher elastic modulus than those of the diaphragm 21 and the piezoelectric film 22. The spacer 23 is sandwiched between and held by the diaphragm 21 and the piezoelectric film 22, and is preferably fixed to at least one of the diaphragm 21 and the piezoelectric film 22 with an adhesive or the like interposed therebetween. The spacer 23 includes a base 25 and a plurality of protrusions 26 extending upwardly therefrom. The base 25 contacts or extends toward the piezoelectric film 22 and is elongated in the length direction. The protrusions 26 protrude from a top surface of the base 25 and contact or extend toward the bottom principle surface of the diaphragm 21. By providing the protrusions 26 on the top surface of the spacer 23, it is possible to reduce a contact area between the diaphragm 21 and the spacer 23. Consequently, even when a finger or the like presses the vicinity of the center of the diaphragm 21 (as viewed in FIG. 1(B)) at a position directly above the spacer 23, it is possible to prevent significant attenuation of vibration. The protrusions 26 are preferably provided at positions facing a frame portion between the touch sensors 31 on the touch panel 30.

Figure 3A:
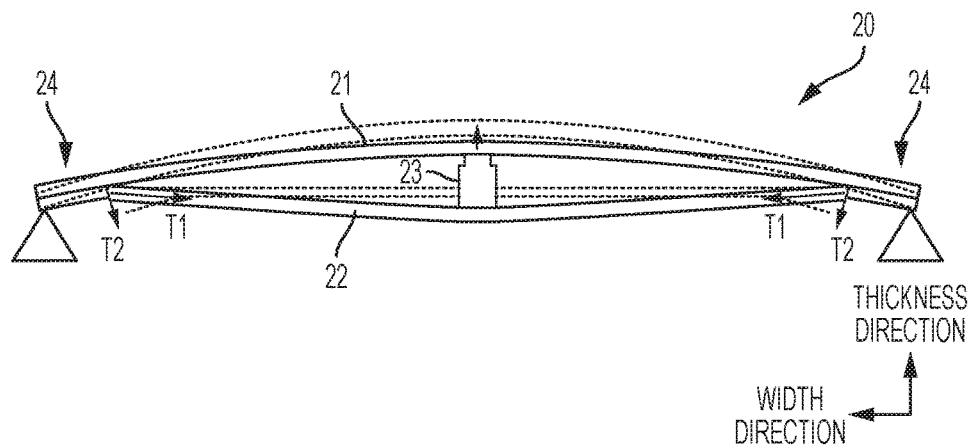
FIGS. 3(A) and 3(B) are side views illustrating a vibration mode of a vibrating device according to the first embodiment.

FIG. 3(A) is a side view illustrating a vibration mode of the vibrating device 20 in a state where a pressing force is not applied. The spacer 23 is in contact with both the lower surface of the diaphragm 21 and an upper surface of the piezoelectric film 22. The dimension of the spacer 23 in the height direction is set to be slightly larger than a gap between the diaphragm 21 and the piezoelectric film 22 (near the center point between the spaced locations 25) under the condition that the spacer 23 is not provided and no voltage is applied to the piezoelectric film 22. As a result, when a voltage is not applied to the piezoelectric film 22, the spacer 23 pushes the piezoelectric film 22 downward in the thickness direction and the piezoelectric film 22 is deformed downwardly at a contact position with the spacer 23.

When an alternating voltage is applied to the piezoelectric film 22, it repeatedly contracts and expands in the width direction. As a result, the tensile force T1 transmitting from the piezoelectric film 22 to the diaphragm 21 cyclically increases and decreases. This causes a force component T2 of the tensile force T1 in a direction perpendicular to a surface of the fixed end areas 24 to also cyclically increase and decrease. Therefore, as indicated by dotted lines in FIG. 3(A), a flexure amount of the diaphragm 21 cyclically increases and decreases. As a result, the center of diaphragm 21 (as viewed in FIG. 3(A)) is cyclically displaced upward and downward. The spacer 23 moves with the film 22 and maintains a spacing between the top surface of the film 22 and the bottom surface of the diaphragm 21.

Figure 3B:
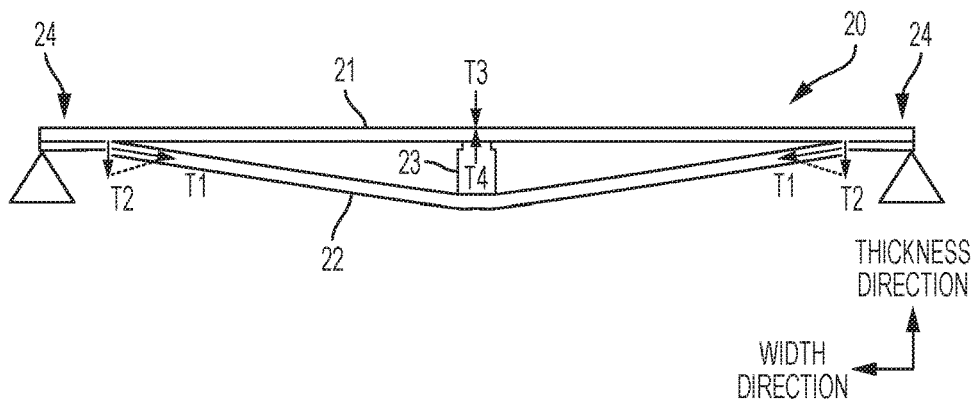

FIG. 3(B) is a side view for explaining a vibration mode of the vibrating device 20 in a state where a pressing force produced by a touch operation or the like is applied. In a state where a pressing force T3 of a user's finger or the like is applied to the diaphragm 21 and the diaphragm 21 is pushed into a roughly flat shape, an elastic force of the vibrating device 20 produces a reaction force T4 with respect to the pressing force T3 which is felt by the user's finger or the like. In this state, the spacer 23, and with it the piezoelectric film 22, are pushed downward. This causes the piezoelectric film 22 to be bent more than it is bent when the pressing force T3 is not applied. Even when the diaphragm 21 and the diaphragm 21 is pushed by the pressing force T3 into a roughly flat shape, the spacer 23 ensures that a gap between the diaphragm 21 and the piezoelectric film 22 is maintained and the piezoelectric film 22 is kept in a state where it is stretched in a direction crossing the surface (i.e., not parallel with the plane) of the fixed end area 24. Consequently, even when the diaphragm 21 is in a flat state, the force component T2 of the tensile force T1 works in a direction perpendicular to the surface of the fixed end area 24.

As a result, when an AC voltage is applied to the piezoelectric film 22, the tensile force T1 transmitted from the piezoelectric film 22 to the diaphragm 21 and the force component T2 of the tensile force T1 cyclically increases and decreases, and the diaphragm 21 cyclically flexes significantly. Thus, the reaction force T4 transmitting from the diaphragm 21 to the user's finger or the like which pushes the diaphragm 21 cyclically fluctuates, so that it is possible to provide a tactile feedback to the user who performs the touch operation. Consequently, even if the position of a key displayed on the touch panel 30 is arbitrarily changed, a touch operation applied to the changed key position will receive a tactile feedback so that it is possible to improve operability and an operational feeling of the touch keyboard.

Because the spacer 23 maintains a gap between the diaphragm 21 and the piezoelectric film 22, it is possible to make the diaphragm 21 thin, suppress rigidity of the diaphragm 21 and make the flexure amount of the diaphragm 21 large compared to the conventional technique.

In the present embodiment, the diaphragm 21 and the piezoelectric film 22 are connected to each other at opposite ends thereof (i.e., at the fixed ends 24) so that it is possible to suppress the number of members which compose the vibrating device.

The tactile feedback device and the vibrating device according to the present invention may employ different configurations from the above configurations. For example, one end of the diaphragm and one end of the piezoelectric film in the width direction may be directly connected, and the other ends in the width direction may be connected with each other with a support member interposed therebetween.

In the present embodiment, the piezoelectric film 22 which is a single layer is stretched on the diaphragm 21. However, the piezoelectric film 22 may be pasted on a film (exciter film) which is a base material such as a resin film, and the exciter film may be stretched on the diaphragm 21 to compose the tactile sense presenting device and the vibrating device according to the present invention. Further, piezoelectric ceramics may be added to the exciter film and the exciter film is stretched on the diaphragm 21 to compose the tactile feedback device and the vibrating device according to the present invention. In this case, a pair of exciter films may be prepared, one end of each exciter film may be connected to the piezoelectric ceramics, and the other end of each exciter film may be connected to the diaphragm 21. Further, a plurality of pairs of exciter films may be prepared, and configured to be connected with one piezoelectric ceramics.

In the foregoing embodiment, the spacer 23 is provided with base 25 and protrusions 26. However, the spacer 23 may have other shapes and the protrusions 26 may be omitted. Protrusions are, however, preferred since they can reduce the contact area between the spacer 23 and the diaphragm 21. When the contact area between the spacer 23 and the diaphragm 21 is smaller, the spacer 23 is prevented from constraining vibration of the diaphragm 21 and the diaphragm 21 can be better vibrated. Further, the protrusions 26 are not limited to columnar shapes illustrated in FIG. 2 and may have other shapes such as semispherical shapes or conical shapes. The protrusions 26 may also have a blade shape protruding upwardly toward the diaphragm 21 in the thickness direction and extending along the width direction of the spacer 23 as viewed in FIG. 2. Still further, the protrusions 26 may have cross sections of polygonal shapes such as a quadrangular prism shape. Moreover, the base 25 of the spacer 23 may have a shape different from a cuboid shape.

In the foregoing embodiment, the spacer 23 is in contact with the diaphragm 21 and the piezoelectric film 22 even when the piezoelectric film 22 is not driven and a tension is applied from the spacer 23 to the piezoelectric film 22. However, the present invention is not limited to this example. For example, the spacer 23 may be set to the substantially same height as the interval between the diaphragm 21 and the piezoelectric film 22 in case where the piezoelectric film 22 is not driven. In this case, even in a state where the spacer 23 is not in contact with both the piezoelectric film 22 when the piezoelectric film 22 is not driven, a tension is not applied from the spacer 23 to the piezoelectric film 22. Consequently, compared to a case where the tension is applied from the spacer 23 to the piezoelectric film 22 at all times, it is possible to reduce a load applied to the piezoelectric film 22 and prevent shape deterioration and characteristics deterioration of the piezoelectric film 22.

Next, a vibrating device according to a second embodiment of the present invention will be described.

Figure 4A:
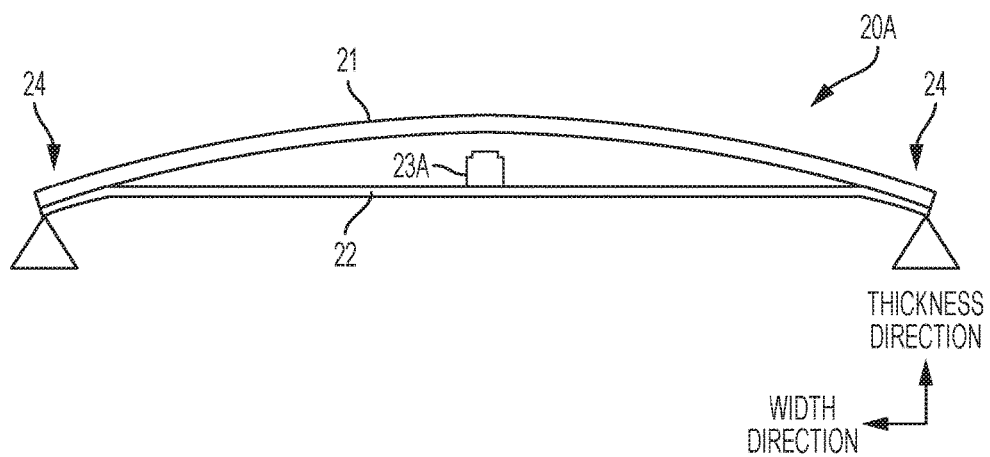
FIGS. 4(A) and 4(B) are side views of a vibrating device according to a second embodiment.

FIG. 4(A) is a side view illustrating a state where a pressing force is not applied to a vibrating device 20A according to the second embodiment. The vibrating device 20A includes a diaphragm 21, a piezoelectric film 22 and a spacer 23A. The spacer 23A has a dimension smaller than a spacing between the diaphragm 21 and the piezoelectric film 22 in the case where the spacer 23A is not provided, and is fixed to either the piezoelectric film 22 or the diaphragm 21 using an adhesive or the like. In the preferred embodiment, the spacer is fixed to the piezoelectric film 22. As a result, where the pressing force is not applied to the vibrating device 20A, the spacer 23A is not in contact with the diaphragm 21 and the piezoelectric film 22 is flat.

Figure 4B:
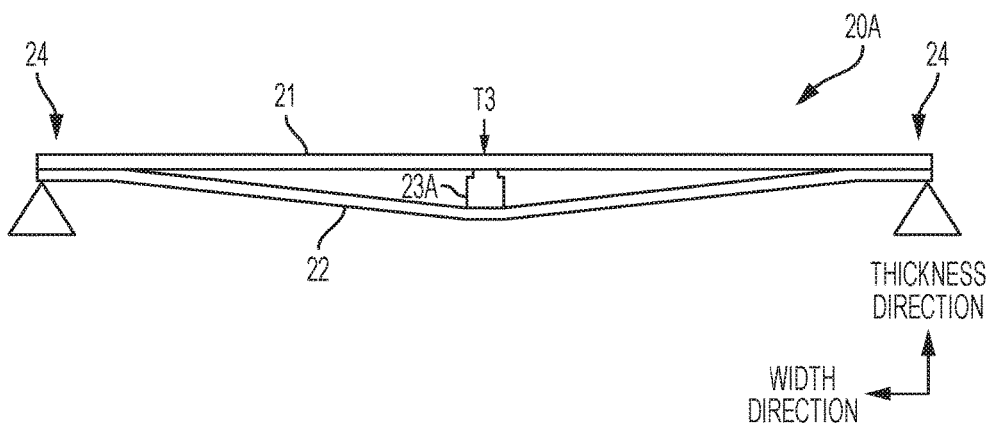

FIG. 4(B) is a side view illustrating a state where a pressing force is applied to the vibrating device 20A according to the second embodiment. When a relatively large pressing force T3 is applied to the diaphragm 21, the diaphragm 21 is pushed into a roughly flat shape. When this occurs the spacer 23A contacts both the diaphragm 21 and the piezoelectric film 22 and pushes the piezoelectric film 22 downward. Thus, the piezoelectric film 22 is bent into a downwardly protruding shape around a contact position with the spacer 23A. Hence, the spacer 23A maintains a gap between the diaphragm 21 and the piezoelectric film 22 and, even when the diaphragm 21 is flattened by the pressing force T3, the piezoelectric film 22 is kept in a state where it is stretched in a direction that is not parallel to the plane (which could be a curved plane) of the diaphragm 21.

With this structure, the vibrating device 20A can vibrate the diaphragm 21 by driving the piezoelectric film 22 when the pressing force T3 is applied to the diaphragm 21 to push the diaphragm 21 in a roughly flat shape. Consequently, it is possible to provide a tactile feedback to a user who performs the touch operation.

Further, when the spacer is not in contact with the diaphragm before a pressing force is applied, vibration of the diaphragm is not constrained by the spacer even when the pressing force is applied. As a result, the time it takes for the vibration of the diaphragm to rise from zero to a desired amplitude is short. This makes it possible to provide a more reliably tactile feedback to an operator who performs the touch operation.

Figure 5A:
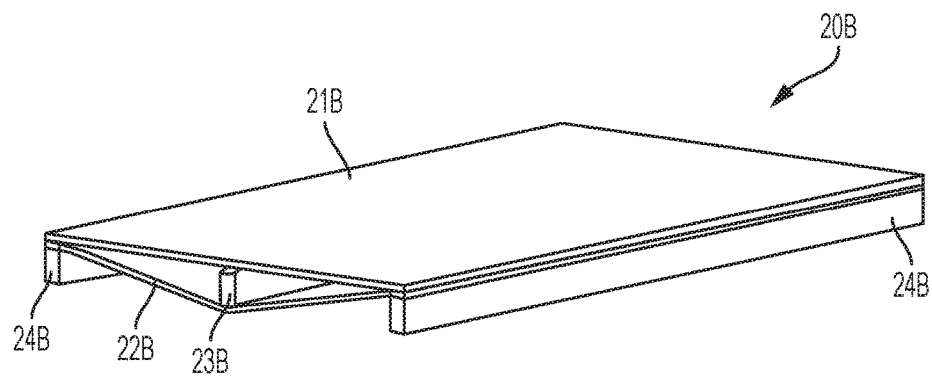
FIGS. 5(A) and 5(B) are a perspective view and a side view, respectively, of a vibrating device according to a third embodiment.

Next, a vibrating device according to a third embodiment of the present invention will be described with reference to FIGS. 5(A) and 5(B). The vibrating device 20B includes a diaphragm 21B, a piezoelectric film 22B, a spacer 23B and fixed portions 24B. As in the foregoing embodiments, the diaphragm 21B and the piezoelectric film 22B are connected at opposed fixed end areas 24B. The unstressed shape of the diaphragm 21B and the prestressed state of the piezoelectric film 22B are chosen to ensure that the diaphragm 21B lies in a flat plane before any excitation voltage is applied to the piezoelectric film 22B. More specifically, an initial shape of the diaphragm 21B in a state where the diaphragm 21B is not connected with the piezoelectric film 22B is a downwardly protruding shape. The tensile force of the piezoelectric film 22B is set such that the diaphragm 21B is deformed into a flat shape by the tensile force applied by the piezoelectric film 22B and an external force applied by the spacer 23B.

The fixed portions 24B are provided, respectively, near the opposite ends of the diaphragm 21B and the piezoelectric film 22B which are connected with each other. The fixed portions 24B protrude downward in the thickness direction of the vibrating device 20B. The fixed portions 24B are preferably supported on an installation surface of a table or the like, and prevent the diaphragm 21B and the piezoelectric film 22B from directly contacting the installation surface.

Figure 5B:
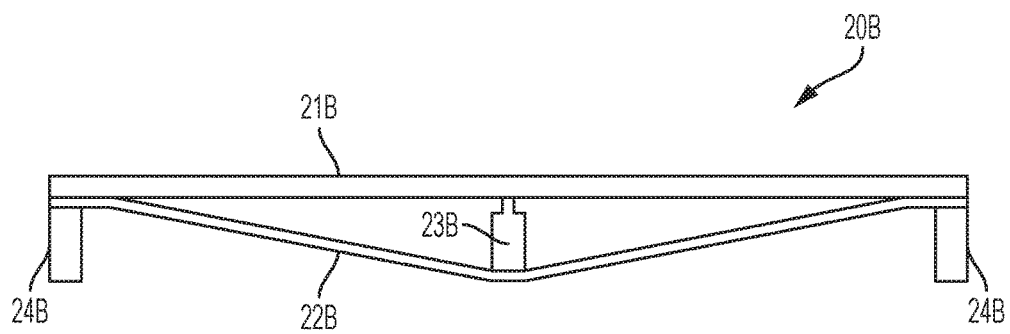

In the vibrating device 20B, the spacer 23B is disposed near the center location as viewed in FIG. 5(B) between the piezoelectric film 22B and the diaphragm 21B. It contacts the lower surface of the diaphragm 21B and the upper surface of the piezoelectric film 22B to secure a gap of a predetermined size between the diaphragm 21B and the piezoelectric film 22B. As a result, the spacer 23B pushes the piezoelectric film 22B downward in the thickness direction, and the piezoelectric film 22B is caused to protrude downward at the position where the spacer 23B contacts the piezoelectric film.

Thus, even when the diaphragm 21B is in a flat state, the piezoelectric film 22B is stretched in a direction crossing a surface of the diaphragm 21B. Consequently, the diaphragm 21B cyclically flexes in response to a driving voltage being applied to the piezoelectric film 22B ensuring that a tactile feedback is provided to the user who performs a touch operation. Thus, by providing the spacer 23B, the vibrating device 20B can vibrate the diaphragm 21B even when it is not in a curved shape. Consequently, it is possible to increase the degree of freedom of the shape of the diaphragm 21B.

Next, a vibrating device according to a fourth embodiment of the present invention will be described with reference to FIGS. 6(A) and 6(B). The vibrating device 20C includes a diaphragm 21C, a piezoelectric film 22C, spacers 23C and 24C and fixed portions 25C. The diaphragm 21C and the piezoelectric film 22C are connected to each other at the opposed fixed end areas 24C and an initial shape of the diaphragm 21C and a tensile force of the piezoelectric film 22C are set such that the diaphragm 21C maintains a flat shape without curving. Fixed portions 25C protrude downward from the fixed end areas 24C. The spacers 23C and 24C are aligned at predetermined intervals in the width direction of the vibrating device 20C (i.e., the horizontal direction in FIG. 6(B)), and contact with a lower surface of the diaphragm 21C and an upper surface of the piezoelectric film 22C to ensure a predetermined gap between the diaphragm 21C and the piezoelectric film 22C. Hence, the piezoelectric film 22C is pushed downward and is bent by the spacers 23C and 24C forming two laterally outward and one central planar section.

The diaphragm 21B is initially in a flat state and the two laterally outward planar sections of the piezoelectric film 22C are stretched in a direction crossing a surface of the diaphragm 21C. Consequently, the diaphragm 21C is bent cyclically upward and downward as a result of a driving voltage applied to the piezoelectric film 22C. This provides a tactile feedback to a user who performs a touch operation.

Figure 7A:
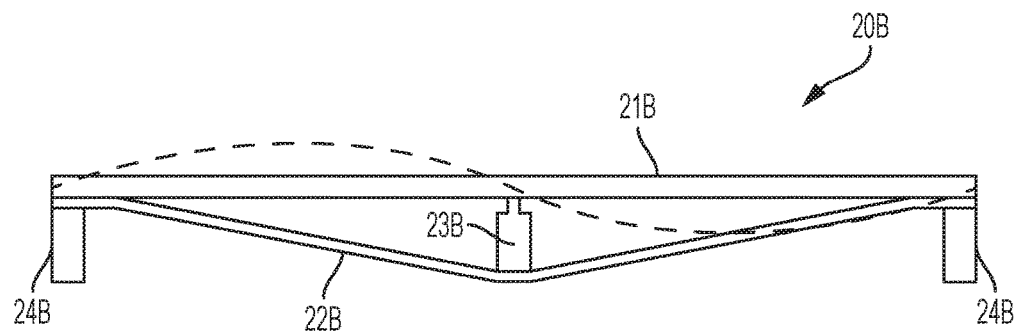
FIGS. 7(A) and 7(B) are side views illustrating a vibration mode of a harmonic produced in the vibrating device according to the third and fourth embodiments.
Figure 7B:
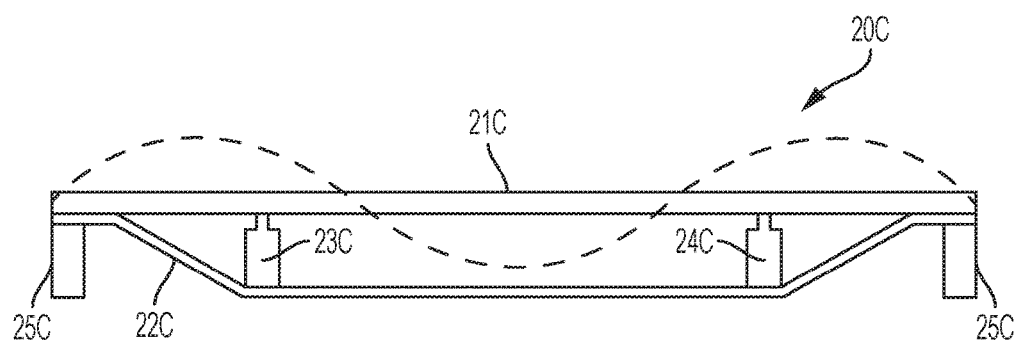

FIGS. 7(A) and 7(B) are views for explaining vibrations caused by a vibrating device 20B according to the third embodiment and the vibrating device 20C according to the fourth embodiment, specifically the vibrating devices 20B and 20C have resonance frequencies determined according to dimensions of diaphragms 21B and 21C in the width direction (the horizontal direction as viewed in FIGS. 7(A) and 7(B)). Hence, when a drive signal of a frequency matching the resonance frequencies is applied to the vibrating devices 20B and 20C, the centers of the vibrating devices 20B and 20C in the width direction serve as nodes and as antinodes, respectively, and opposite ends of the vibrating devices 20B and 20C are fixed ends. Further, such a harmonic that contact positions with spacers 23B, 23C and 24C in the diaphragms 21B and 21C serve as nodes of the vibration is superimposed on the vibrations of the diaphragms 21B and 21C.

As illustrated in FIG. 7(A), the spacer 23B is in contact with the center of the diaphragm 21B in the width direction (and the vicinity thereof), so that the vibrating device 20B causes vibration of such a harmonic that this contact position serves as a node of the vibration. That is, vibration of a second harmonic whose wavelength is equal to the width dimension of the diaphragm 21B is superimposed on the vibration of the vibrating device 20B.

As illustrated in FIG. 7(B), the spacers 23C and 24C are aligned at an appropriate interval in the width direction of the diaphragm 21C, so that the vibrating device 20C causes vibration of such a harmonic that contact positions with the spacers 23C and 24C serve as nodes of the vibration. That is, the vibration of a third harmonic is superimposed on the vibration of the vibrating device 20C, and the dimension of the diaphragm 21C in the width direction is 1.5 times as large as wavelength of the third harmonic.

Hence, the vibrating device 20B according to the third embodiment and the vibrating device 20C according to the fourth embodiment differ in frequencies of harmonics produced by the diaphragms 21B and 21C even when the dimensions of the diaphragms 21B and 21C in the width direction are equal. Generally, a frequency of vibration within a range of 100 Hz to 300 Hz is good for a tactile feedback on a finger (which means high sensitivity). Consequently, when resonance frequencies of the diaphragms 21B and 21C are frequencies lower than 100 Hz, it is possible to adjust the harmonics of the vibrations caused by the diaphragms 21B and 21C to frequencies of 100 Hz to 300 Hz by adjusting the number of and the positions of the spacers. Consequently, even when the resonance frequencies of the diaphragms 21B and 21C are lower than 100 Hz, it is possible to provide good tactile feedback to the user's finger or the like.

Figure 8A:
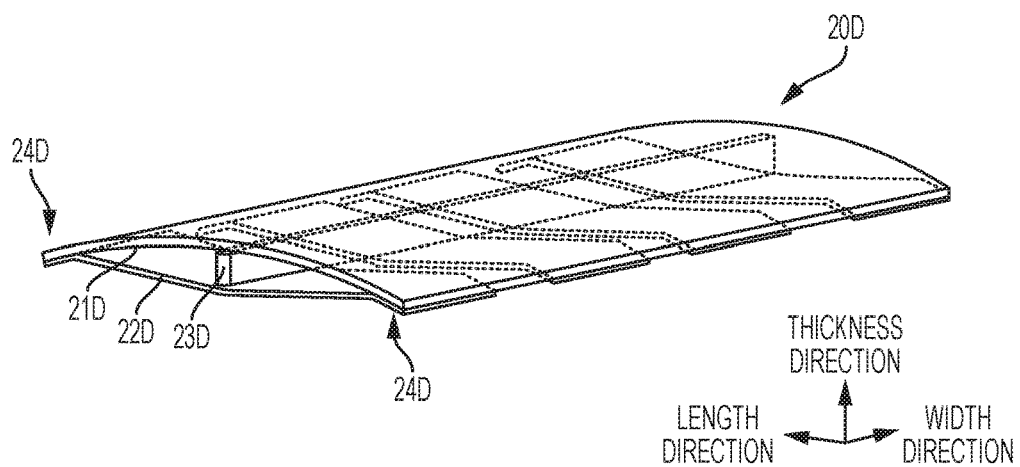
FIGS. 8(A) and 8(B) are a perspective view and a side view, respectively, of a vibrating device according to a fifth embodiment.
Figure 8B:
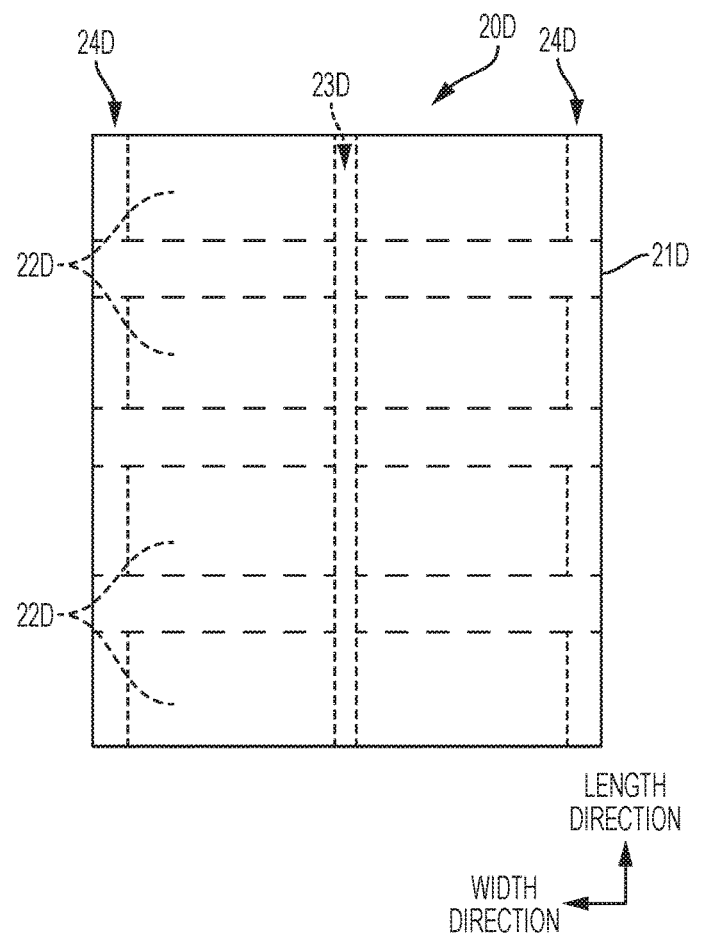
Figure 9A:
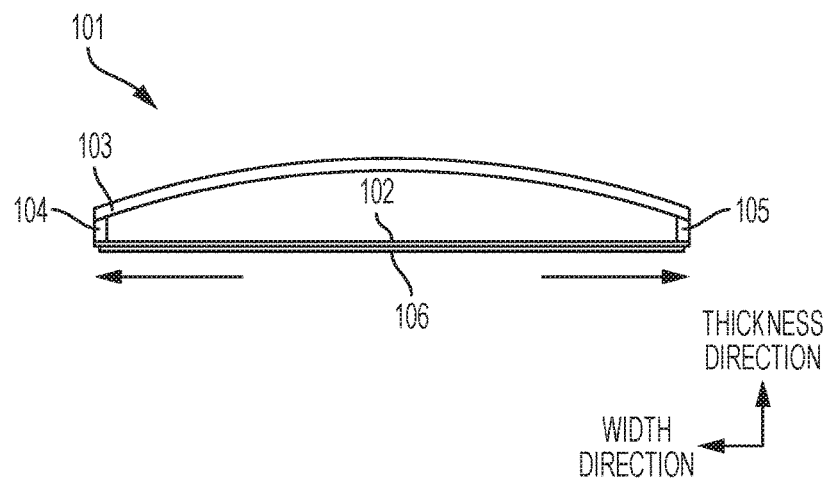
FIGS. 9(A) and 9(B) are views for explaining a conventional structure of a vibrating device.
Figure 9B:
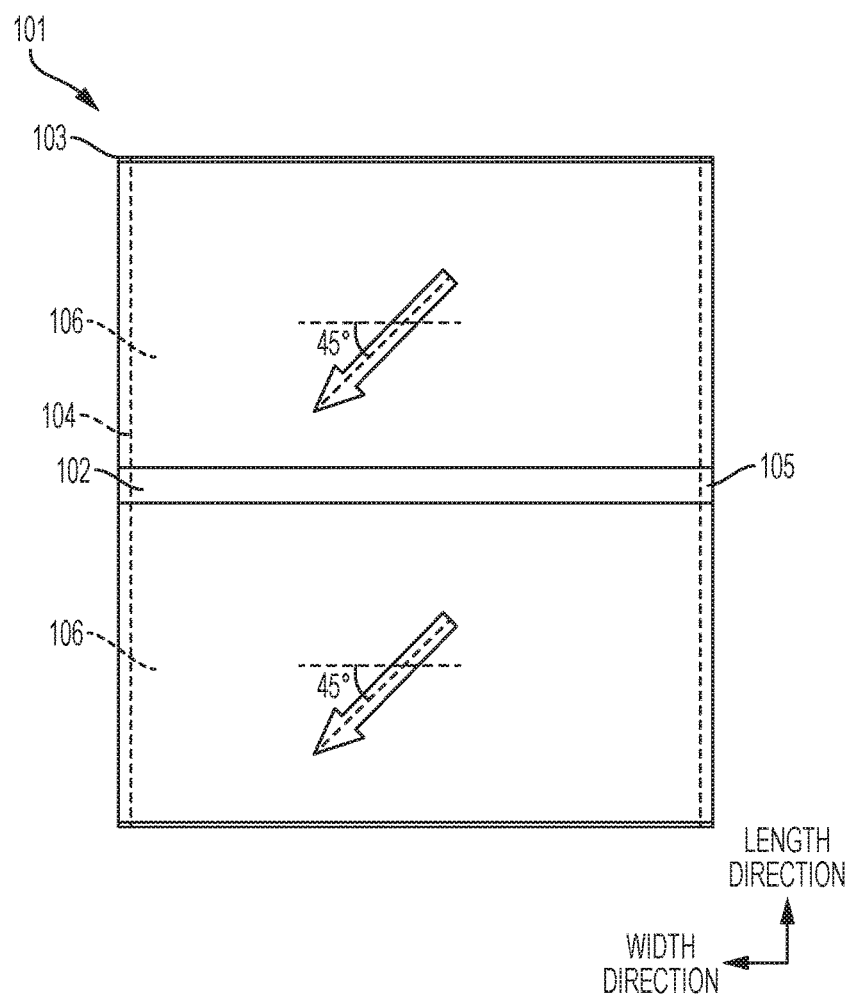

Next, a vibrating device according to a fifth embodiment of the present invention will be described with reference to FIGS. 8(A) and 8(B). The vibrating device 20D includes a diaphragm 21D, a plurality of piezoelectric films 22D and a spacer 23D. Each of the piezoelectric films 22D preferably has a rectangular shape in plan view. Each piezoelectric film 22D has a width direction which is shorter than its length direction, and are aligned in parallel to one another (See FIG. 8(A)). The length of each of the piezoelectric films 22D is substantially the same as the width of the diaphragm 21D, and is provided with fixed end areas 24D which are connected with the diaphragm 21D. The spacer 23D is in contact with a lower surface of the diaphragm 21D and upper surfaces of the plurality of piezoelectric films 22D and extends in the length direction of the vibrating device 20D over the plurality of piezoelectric films 22D so as to ensure a predetermined spacing between the diaphragm 21D and the plurality of piezoelectric films 22D. As a result, a plurality of piezoelectric films 22D are pushed downward in a thickness direction and are bent by the spacer 23D.

In the vibrating device 20D, the shape of each piezoelectric film 22D is a strip (rectangular) shape which is elongated in its length direction (the width direction of the vibrating device 20D). Therefore, when driven, each piezoelectric film 22D stretches or contracts primarily in its length direction. Consequently, by vibrating the diaphragm 21D including a plurality of these piezoelectric films 22D, it is possible to effectively vibrate the diaphragm 21D in its width direction. The spacer 23D ensures that the diaphragm 21D will be vibrated when the diaphragm 21D is pressed downwardly. Consequently, even when the tactile feedback device is composed of the vibrating device 20D, it is possible to present a tactile feedback to a user who performs the touch operation.

In the foregoing embodiment, a single spacer is disposed across a plurality of piezoelectric films. Alternatively, a plurality of shorter spacers may be individually disposed on respective piezoelectric films. By disposing a plurality of spacers on a plurality of piezoelectric films, it is possible to individually adjust a tension to be applied to each piezoelectric film, and therefore to more effectively vibrate the diaphragm.

Figure 6A:
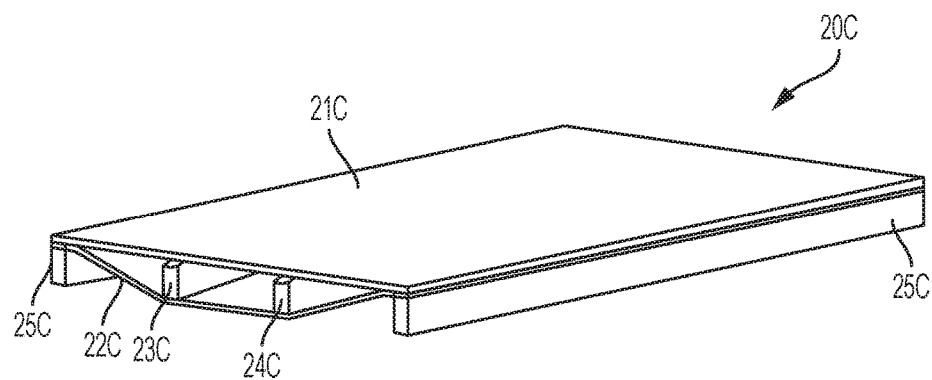
FIGS. 6(A) and 6(B) are a perspective view and a side view, respectively, of a vibrating device according to a fourth embodiment.
Figure 6B:
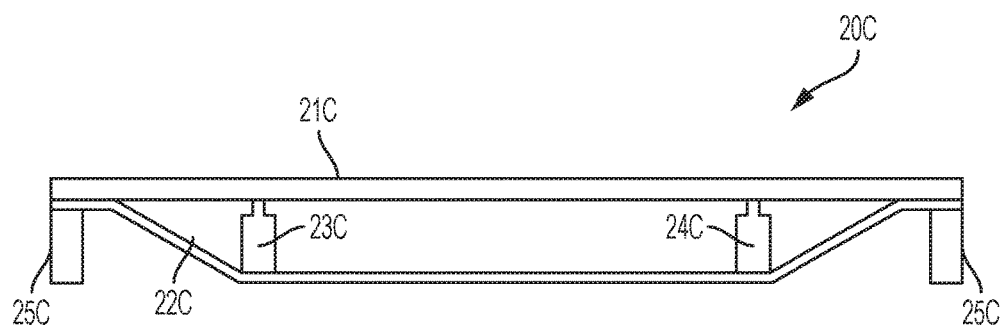

Further, like the configuration illustrated in FIGS. 6(A) and 6(B), a plurality of spacers may be aligned in the length direction of each piezoelectric film in the present embodiment.

The present invention can be carried out as described above, yet the present invention can be carried out while employing configurations other than the above configurations as long as these configurations correspond to the claims. For example, the vibrating device according to the present invention may be used for other devices than the tactile sense presenting device such as a flat speaker.

The invention claimed is:

1. A vibrating device, comprising:
 a flexible diaphragm;
 a touch panel located on the flexible diaphragm;
 a film which deforms in response to the application of electrical energy thereto, the film being rigidly attached to the flexible diaphragm at two spaced locations with a major surface of the film facing a major surface of the flexible diaphragm; and
 a spacer located between the two spaced locations and ensuring that the major surface of the flexible diaphragm is spaced from the major surface of the film, the spacer including a base and a plurality of projections protruding from the base in the direction of the flexible diaphragm.

2. The vibrating device in accordance with claim 1, wherein the vibrating device has a length, a width and a thickness, the flexible diaphragm and the film are spaced apart in the thickness direction and the flexible diaphragm is flexible in the thickness direction.

3. The vibrating device in accordance with claim 1, wherein the flexible diaphragm deforms in response to deformation of the film when electrical energy is applied to the film.

4. The vibrating device in accordance with claim 1, wherein the diaphragm vibrates in response to vibration of the film when an alternating electric voltage is applied to the film.

5. The vibrating device according to claim 1, wherein the spacer contacts both the flexible diaphragm and the film both before electrical energy is applied to the film and while electrical energy is applied to the film.

6. The vibrating device according to claim 1, wherein the base portion has a top surface and a bottom surface, the plurality of projections extend from the too surface of the base toward the flexible diaphragm and the bottom surface of the base faces the film.

7. The vibrating device according to claim 6, wherein the base is in contact with the film and the plurality of protrusions are in contact with the flexible diaphragm.

8. The vibrating device according to claim 6, wherein the vibrating device has a length, a width and a thickness extending perpendicular to one another and the spacer is elongated and extends in a length direction of the vibrating device.

9. The vibrating device according to claim 8, wherein the plurality of projections extend in the thickness direction of the vibrating device.

10. The vibrating device according to claim 8, wherein a plurality of the spacers are aligned in the length direction of the vibrating device.

11. The vibrating device according to claim 1, wherein the flexible diaphragm has a flat shape when electrical energy is not applied to the film.

12. The vibrating device according to claim 1, wherein the film comprises a chiral polymer film or a polyvinylidene fluoride film.

13. The vibrating device according to claim 1, further comprising a circuit for applying a drive voltage to the film in response to a detection of a touch operation on the touch panel, the drive voltage causing the film to vibrate.

14. The vibrating device according to claim 1, wherein the flexible diaphragm is curved when it is in non-stressed state.

15. The vibrating device according to claim 1, wherein the spacer divides the flexible diaphragm into two flat planar sections.

16. A tactile feedback device comprising:
 (a) a vibrating device including:
  (i) a flexible diaphragm;
  (ii) a film which deforms in response to the application of electrical energy thereto, the film being rigidly attached to the flexible diaphragm at two spaced locations with a major surface of the film facing a major surface of the flexible diaphragm; and
  (iii) a spacer located between the two spaced locations and ensuring that the major surface of the flexible diaphragm is spaced from the major surface of the film; the spacer including a base and a plurality of projections protruding from the base in the direction of the diaphragm:
 (b) a touch sensor coupled to the diaphragm and generating an output signal in response to a touch operation; and
 (c) means for applying electrical energy to the film in response to the output signal.

17. The tactile feedback device in accordance with claim 16, wherein the vibrating device has a length, a width and a thickness, the flexible diaphragm and the film are spaced apart in the thickness direction and the flexible diaphragm is flexible in the thickness direction.

18. The tactile feedback device in accordance with claim 16, wherein the flexible diaphragm deforms in response to deformation of the film when electrical energy is applied to the film.

19. The tactile feedback device in accordance with claim 16, wherein the flexible diaphragm, and with it the touch sensor, vibrates in response to vibration of the film when an alternating electric voltage is applied to the film.

20. The tactile feedback device according to claim 16, wherein the spacer contacts both the flexible diaphragm and the film both before electrical energy is applied to the film and while it is applied to the film.

21. The tactile feedback device according to claim 16, wherein the base portion has a bottom surface and a top surface, the plurality of projections extend from the top surface of the base toward the flexible diaphragm and the bottom surface of the base faces the film.

22. The tactile feedback device according to claim 21, wherein the base is in contact with the film and the plurality of protrusions are in contact with the flexible diaphragm.

23. The tactile feedback device according to claim 21, wherein the vibrating device has a length, a width and a thickness extending perpendicular to one another and the spacer is elongated and extends in length direction of the vibrating device.

24. The tactile feedback device according to claim 16, further comprising a touch panel located on the flexible diaphragm.

25. The tactile feedback device according to claim 24, further comprising a circuit for applying a drive voltage to the film in response to a detection of a touch operation on the touch panel, the drive voltage causing the film to vibrate.

26. The tactile feedback device according to claim 16, wherein the flexible diaphragm is curved when it is in non-stressed state.

27. The tactile feedback device according to claim 16, wherein the spacer divides the flexible diaphragm into two flat planar sections.

\* \* \* \* \*